(12) United States Patent
Feng et al.

(10) Patent No.: US 8,172,646 B2
(45) Date of Patent: May 8, 2012

(54) MAGNETICALLY ACTUATED CHUCK FOR EDGE BEVEL REMOVAL

(75) Inventors: Jingbin Feng, Lake Oswego, OR (US);
Aaron LaBrie, Oregon City, OR (US);
Kousik Ganesan, Tualatin, OR (US)

(73) Assignee: Novellus Systems, Inc., San Jose, CA (US)

( * ) Notice: Subject to any disclaimer, the term of this patent is extended or adjusted under 35 U.S.C. 154(b) by 591 days.

(21) Appl. No.: 12/394,339

(22) Filed: Feb. 27, 2009

(65) Prior Publication Data

US 2010/0219920 A1    Sep. 2, 2010

(51) Int. Cl.
*B24B 1/00* (2006.01)
(52) U.S. Cl. ......... 451/41; 451/367; 451/397; 451/385; 279/106; 414/941
(58) Field of Classification Search ................... 451/367, 451/397, 385; 414/217, 217.1, 936, 941; 279/106, 109; 294/213; 269/8, 71
See application file for complete search history.

(56) References Cited

U.S. PATENT DOCUMENTS

| | | |
|---|---|---|
| 4,313,266 A | 2/1982 | Tam |
| 4,788,994 A | 12/1988 | Shinbara |
| 4,968,375 A | 11/1990 | Sato et al. |
| 5,009,738 A | 4/1991 | Gruenwald et al. |
| 5,376,216 A * | 12/1994 | Yoshioka et al. .......... 156/345.55 |
| 5,384,008 A | 1/1995 | Sinha et al. |
| 5,486,234 A | 1/1996 | Contolini et al. |
| 5,532,190 A | 7/1996 | Goodyear et al. |
| 5,674,410 A | 10/1997 | Nakajima et al. |
| 5,798,016 A | 8/1998 | Oehrlein et al. |
| 5,810,940 A | 9/1998 | Fukazawa et al. |
| 5,882,433 A | 3/1999 | Ueno |
| 5,897,379 A | 4/1999 | Ulrich et al. |

(Continued)

FOREIGN PATENT DOCUMENTS

DE    4109955    10/1992

(Continued)

OTHER PUBLICATIONS

U.S. Appl. No. 11/248,874, Mayer et al., "Edge bevel removal of copper from silicon wafers", filed Apr. 25, 2000.

(Continued)

*Primary Examiner* — George Nguyen
(74) *Attorney, Agent, or Firm* — Weaver Austin Villeneuve & Sampson LLP

(57) ABSTRACT

Provided are magnetically actuated wafer chucks that permit a wafer to be clamped or unclamped at any time during a process and at any rotational speed, as desired. Such wafer chucks may include constraining members that are movable between open and closed positions. In a closed position, a constraining member aligns the wafer after wafer handoff and/or clamps the wafer during rotation to prevent it from flying off the chuck. In an open position, the constraining member moves away from the wafer to allow liquid etchant to flow from the wafer edge without obstruction. The constraining members may be, for example, cams, attached to arms or links of the chuck. The cams or other constraining members move between open and closed positions by self-balancing forces including a first force, such as a spring force, that acts to move a cam in a first direction, and a non-contact actuateable force, such as a magnetic force, that acts to move the cam in the opposite direction. The resulting cam motion is smooth and continuous.

27 Claims, 11 Drawing Sheets

U.S. PATENT DOCUMENTS

| | | | |
|---|---|---|---|
| 5,954,072 A * | 9/1999 | Matusita | 134/149 |
| 5,989,342 A * | 11/1999 | Ikeda et al. | 118/52 |
| 6,046,097 A | 4/2000 | Hsieh et al. | |
| 6,050,506 A | 4/2000 | Guo et al. | |
| 6,051,501 A | 4/2000 | Becker et al. | |
| 6,114,254 A | 9/2000 | Rolfson | |
| 6,162,739 A | 12/2000 | Sumnitsch et al. | |
| 6,167,893 B1 * | 1/2001 | Taatjes et al. | 134/147 |
| 6,217,034 B1 | 4/2001 | Smedt et al. | |
| 6,267,853 B1 * | 7/2001 | Dordi et al. | 204/232 |
| 6,273,484 B1 * | 8/2001 | Peng | 294/86.4 |
| 6,297,155 B1 | 10/2001 | Simpson et al. | |
| 6,306,245 B1 | 10/2001 | Yanagisawa et al. | |
| 6,309,981 B1 | 10/2001 | Mayer et al. | |
| 6,333,275 B1 | 12/2001 | Mayer et al. | |
| 6,363,623 B1 * | 4/2002 | Abraham | 34/58 |
| 6,413,436 B1 | 7/2002 | Aegerter et al. | |
| 6,506,689 B2 | 1/2003 | Rolfson | |
| 6,516,815 B1 | 2/2003 | Stevens et al. | |
| 6,520,839 B1 | 2/2003 | Gonzalez-Martin et al. | |
| 6,537,416 B1 | 3/2003 | Mayer et al. | |
| 6,578,853 B1 | 6/2003 | Treur et al. | |
| 6,586,342 B1 | 7/2003 | Mayer et al. | |
| 6,589,878 B1 | 7/2003 | Lorimer | |
| 6,817,640 B2 * | 11/2004 | Menon et al. | 294/103.1 |
| 6,838,355 B1 | 1/2005 | Stamper et al. | |
| 6,967,174 B1 | 11/2005 | Mayer et al. | |
| 7,029,567 B2 | 4/2006 | Basol | |
| 7,284,760 B2 * | 10/2007 | Siebert et al. | 279/4.12 |
| 7,780,867 B1 | 8/2010 | Mayer et al. | |
| 7,959,139 B2 * | 6/2011 | Fukui et al. | 269/8 |
| 2002/0160701 A1 * | 10/2002 | Fehr et al. | 451/283 |
| 2002/0179247 A1 | 12/2002 | Davis et al. | |
| 2004/0023475 A1 | 2/2004 | Bonser et al. | |
| 2004/0023502 A1 | 2/2004 | Tzou et al. | |
| 2005/0127361 A1 | 6/2005 | Hatano et al. | |
| 2007/0068900 A1 | 3/2007 | Kim et al. | |
| 2007/0273108 A1 * | 11/2007 | Kitatsuru et al. | 279/106 |
| 2010/0055924 A1 | 3/2010 | Ganesan et al. | |

FOREIGN PATENT DOCUMENTS

| | | |
|---|---|---|
| JP | 04-135110 | 5/1992 |
| JP | 04-186626 | 7/1992 |
| JP | 05-013322 | 1/1993 |
| JP | 05-326483 | 12/1993 |
| JP | 06-045302 | 2/1994 |
| JP | 09-171989 | 6/1997 |
| WO | 99-46064 | 9/1999 |

OTHER PUBLICATIONS

U.S. Appl. No. 11/479,353, Mountsier et al., "Methods for removing deposits from the edge of a silicon substrate using plasma discharge", filed Jun. 30, 2006.
U.S. Appl. No. 11/515,346, Henri et al., "Edge removal of films using externally generated plasma species", filed Aug. 31, 2006.
U.S. Appl. No. 11/737,045, Stephens et al., "Wafer chuck with aerodynamic design for turbulence reduction", filed Apr. 18, 2007.
U.S. Appl. No. 12/199,412, Ganesan et al., "Apparatus and method for edge bevel removal of copper from silicon wafers", filed Aug. 27, 2008.
U.S. Appl. No. 11/248,874, Office Action mailed Jul. 6, 2006.
U.S. Appl. No. 11/248,874, Office Action mailed Aug. 23, 2007.
U.S. Appl. No. 11/248,874, Office Action mailed Nov. 28, 2007.
U.S. Appl. No. 11/248,874, Office Action mailed Jun. 4, 2008.
U.S. Appl. No. 11/479,353, Office Action mailed Dec. 2, 2008.
Glen Research Center, "Shape Effects on Drag", National Aeronautics and Space Administration website http://www.grc.nasa.gov/WWW/K/airplane/shaped.html downloaded Apr. 18, 2007.
U.S. Appl. No. 11/515,346, Office Action mailed May 6, 2009.
U.S. Appl. No. 11/479,353, Office Action mailed Jun. 1, 2009.
U.S. Appl. No. 11/515,346, Office Action mailed Nov. 12, 2009.
U.S. Appl. No. 11/479,353, Office Action mailed Dec. 7, 2009.
U.S. Appl. No. 11/248,874, Office Action mailed Nov. 30, 2009.
Wolf, Stanley et al., "Silicon Processing for the VLSI Era, vol. 1: Process Technology", Lattice Press 91986, pp. 516-520.
U.S. Appl. No. 11/515,346, Office Action mailed Mar. 31, 2010.
U.S. Appl. No. 11/737,045, Office Action mailed Jun. 24, 2010.
U.S. Appl. No. 11/248,874, Notice of Allowance mailed Jun. 4, 2010.
U.S. Appl. No. 11/515,346, Office Action mailed Oct. 19, 2010.
U.S. Appl. No. 11/737,045, Office Action mailed Dec. 9, 2010.
Bird, R. Bryan et al., "Chapter 6: Interphase transport isothermal systems", John Wiley and Sons, 1960, pp. 180-1993.
U.S. Appl. No. 11/515,346, Office Action mailed Apr. 28, 2011.
U.S. Appl. No. 12/701,387, Office Action mailed Sep. 15, 2011.
U.S. Appl. No. 11/515,346, Notice of Allowance mailed Sep. 21, 2011.
Allowed Claims as of Sep. 21, 2011 for U.S. Appl. No. 11/515,346.

* cited by examiner

MAGNETICALLY ACTUATED CHUCK FOR EDGE BEVEL REMOVAL

BACKGROUND OF THE INVENTION

This invention relates to technology for rotating a semiconductor wafer during post copper electroplating processing in a post electrofill module. More particularly, the invention pertains to wafer chucks used in such modules to align, rotate and clamp the semiconductor wafer. The modules typically perform a metal etch removing the edge bevel copper, rinse the wafer, and dry the wafer. A post electrofill module is typically a part of an integrated electrofill module that includes metal deposition, etching, and any other pre- and post treatment.

During integrated circuit fabrication, conductive metal is needed on the active circuit region of the wafer, i.e., the main interior region on the front side, but is undesirable elsewhere. In a typical copper Damascene process, the formation of the desired conductive routes generally begins with a thin physical vapor deposition (PVD) of the metal, followed by a thicker electrofill layer (which is formed by electroplating). The PVD process is typically sputtering. In order to maximize the size of the wafer's useable area (sometimes referred to herein as the "active surface region") and thereby maximize the number of integrated circuits produced per wafer), the electrofilled metal must be deposited to very near the edge of the semiconductor wafer. Thus, it is necessary to allow physical vapor deposition of the metal over the entire front side of the wafer. As a byproduct of this process step, PVD metal typically coats the front edge area outside the active circuit region, as well as the side edge, and to some degree, the backside. Electrofill of the metal is much easier to control, since the electroplating apparatus can be designed to exclude the electroplating solution from undesired areas such as the edge and backside of the wafer. One example of plating apparatus that constrains electroplating solution to the wafer active surface is the SABRE™ clamshell electroplating apparatus available from Novellus Systems, Inc. of San Jose, Calif., aspects of which are described in U.S. Pat. No. 6,156,167, "CLAMSHELL APPARATUS FOR ELECTROCHEMICALLY TREATING SEMICONDUCTOR WAFERS," which is herein incorporated by reference in its entirety.

The PVD metal remaining on the wafer edge after electrofill is undesirable for various reasons. One reason is that PVD metal layers are thin and tend to flake off during subsequent handling, thus generating undesirable particles. This can be understood as follows. At the front side edge of the wafer, the wafer surface is beveled. Here the PVD layers are not only thin, but also unevenly deposited. Thus, they do not adhere well. Adhesion of subsequent dielectric layers onto such thin metal is also poor, thus introducing the possibility of even more particle generation. By contrast, the PVD metal on the active interior region of the wafer is simply covered with thick, even electrofill metal and planarized by CMP down to the dielectric. This flat surface, which is mostly dielectric, is then covered with a barrier layer substance such as SiN that both adheres well to the dielectric and aids in the adhesion of subsequent layers.

To address these problems, semiconductor equipment may have to allow etching of the unwanted residual metal layers. Various difficulties will be encountered in designing a suitable etching system. One such difficulty involves the design of wafer chucks that hold the semiconductor wafer during the metal etch. First, the system must align the wafer on chuck for rotation. Conventionally, such alignment is done by placing the wafer in a separate alignment module and then transporting it the chuck. Unfortunately, this approach involves a separate alignment step that can add expense and affect IC throughput. Further, the wafer chuck should not contact the wafer edges during the actual etching of unwanted metal from those regions. Otherwise, the viscous etchant would not be able flow over the side edge of the wafer unimpeded. Still further, the chuck should be able to clamp the wafer during acceleration, deceleration and high-speed rotation (e.g., greater than 750 rpm), such as is typically used in drying operations. The chuck must be made of materials that are resistant to the etching properties of the etchant. The chuck should also be designed to facilitate wetting and rinsing operations, and to allow unimpeded application of the etchant to the backside of the wafer.

For these reasons, an improved wafer chuck design is required for etching unwanted metal from semiconductor wafers.

SUMMARY OF THE INVENTION

Provided are magnetically actuated wafer chucks that permit a wafer to be clamped or unclamped at any time during a process and at any rotational speed, as desired. Such wafer chucks may include constraining members that are movable between open and closed positions. In a closed position, a constraining member aligns the wafer after wafer handoff and/or clamps the wafer during rotation to prevent it from flying off the chuck. In an open position, the constraining member moves away from the wafer to allow liquid etchant to flow from the wafer edge without obstruction. The constraining members may be, for example, cams, attached to arms or links of the chuck. The cams or other constraining members move between open and closed positions by self-balancing forces including a first force, such as a spring force, that acts to move a cam in a first direction, and a non-contact actuateable force, such as a magnetic force, that acts to move the cam in the opposite direction. The resulting cam motion is smooth and continuous.

One aspect of the invention relates to a wafer chuck assembly for a module that processes wafers. The assembly includes a clamping member moveable between a clamping position and a non-clamping position, wherein the clamping member in the clamping position clamps a rotating wafer by constraining the wafer at its edge; a linkage system connected to the clamping member to move the clamping member between the clamping position and the non-clamping position; and an actuation assembly to provide non-contact actuation of the linkage system to move the clamping member between the clamping position and the non-clamping position. According to various embodiments, in its non-clamping position, the clamping member does not contact the wafer, allowing liquid etchant to etch material from the wafer edge. In certain embodiments, the clamping member is below the plane of the wafer.

In certain embodiments, the actuation assembly includes an annular magnetic member that provides non-contact actuation of the linkage system via magnetic force. According to various embodiments, the linkage system includes a driving link movable in a first rotational direction by a first force and movable in a second rotational direction opposite the first rotational direction by a repulsive magnetic force. In certain embodiments, the driving link is coupled to a spring mechanism, said spring mechanism providing the first force.

In certain embodiments, the driving link is coupled to a permanent magnet having a first surface that faces a surface of the annular magnetic member, wherein the magnetic polarities of said first surface and said surface of the annular magnetic member are the same. In this manner, repulsive force is provided between the annular magnetic member and permanent magnet. The actuation assembly in certain embodiments includes a linear actuator to extend the annular magnetic member to and retract the annular magnetic member from a position proximate to the linkage system. Extension of the annular magnetic member to the position proximate to the linkage system moves the cam to a non-clamping position and retraction of the annular magnetic member from the position proximate to the linkage system moves the cam to a clamping position in certain embodiments.

In certain embodiments, the wafer chuck assembly also includes means to protect the actuation assembly from exposure to a wet environment. For example, may further include a shield between the linkage system and the actuation assembly. In certain embodiments, the clamping member is a cam that is rotatable about a pivot. The chuck assembly may also include a stop member to define the clamping position.

Another aspect of the invention relates to a wafer chuck that includes an actuating assembly having an annular magnet having a top face and a plurality of constraining sub-assemblies. Each constraining sub-assembly has a first magnet having a first face arranged to oppose said top face of the annular magnet; a driving link coupled driving link coupled to the first magnet and coupled to a mechanism, wherein engagement between the first magnet and the annular magnet provides a magnetic force to rotate said driving link in a first direction and the mechanism provides a force to counter said magnetic force; a constraining member coupled to said driving link to rotate about a first fixed pivot; wherein rotation of the constraining member about the first fixed pivot moves the constraining member between a constraining position and a non-constraining position, wherein the constraining member in its closed position constrains a wafer at its edge.

The chuck may further include a shield disposed between the annular magnet and the plurality of constraining sub-assemblies. In certain embodiments, the constraining member of each sub-assembly is coupled to the driving link of said sub-assembly via a second link. In certain embodiments, the mechanism is a spring mechanism and the force to counter said magnetic force is a spring force.

Another aspect of the invention relates to a wafer chuck assembly including a rotatable wafer chuck; constraining means for constraining a wafer rotating on said rotatable chuck, said constraining means movable between a constraining position and non-constraining position; and means for actuating the constraining means via non-contact actuation.

Another aspect of the invention relates to methods of non-contact actuation of one or more rotating members. In certain embodiments, the methods involve extension and retraction of a non-rotating magnetic ring to actuate the rotating member via a linkage system. Methods of etching a wafer using non-contact actuation of a constraining member are also provided.

Details of these and other aspects of the invention are described below with reference to the drawings.

BRIEF DESCRIPTION OF THE DRAWINGS

FIG. 7A illustrates both alignment and clamping members disengaged from the wafer and FIG. 7B illustrates the clamping member engaging the wafer.

DETAILED DESCRIPTION OF THE PREFERRED EMBODIMENTS

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

Introduction

Figure 1:
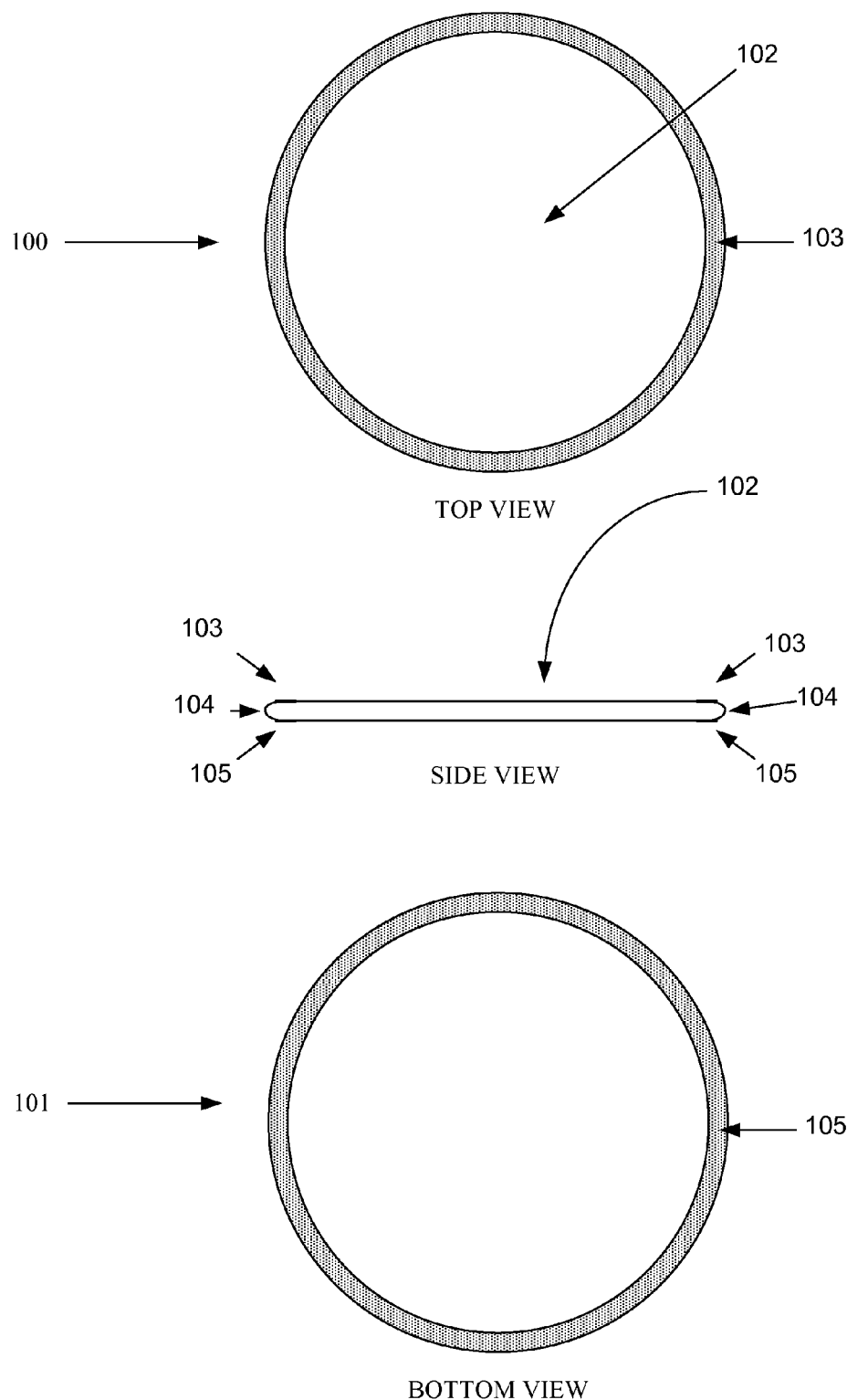
FIG. 1 is an illustration of a semiconductor wafer showing the location of the edge bevel region that is etched in accordance with this invention.

As indicated, aspects of this invention pertain to a wafer chuck design that improves uniformity and tolerance of edge exclusion etched during EBR and particle performance. To facilitate understanding the concepts of this invention, a schematic illustration of a semiconductor wafer is shown in FIG. 1. As shown, such semiconductor wafer has a top or "front" side 100 and a "backside" 101. The wafer also has an interior "active circuit region" 102 where integrated circuit devices with associated conductive metal routes are formed. To make maximum use of expensive semiconductor material, this active circuit region should constitute a high fraction of the area on the front side 100 of the wafer. As discussed further below, the wafer chucks described herein permit large active circuit regions, e.g., up to within 0.5 mm of the outer boundary of the wafer. As shown, integrated circuit wafers also include a "front edge" area 103, which is the region on the front of the wafer that lies outside the active circuit region, a "side edge" area 104 (sometimes referred to herein as an "edge bevel region") and a "back edge" area 105. The side edge lies in the area between the front side and the backside, and the back edge is roughly the area near the outer boundary of the wafer on its backside, approximately analogous to the front edge area.

A "post-electrofill module" (PEM) or "EBR module" as referred to in this invention is a module that is specifically designed to carry out the edge bevel removal (EBR) process, backside etch (BSE) process and ancillary processes including pre-rinsing, rinsing, acid washing and drying. An integrated-electrofill module as referred to in this invention is a module that carries out electrofill.

Figure 2:
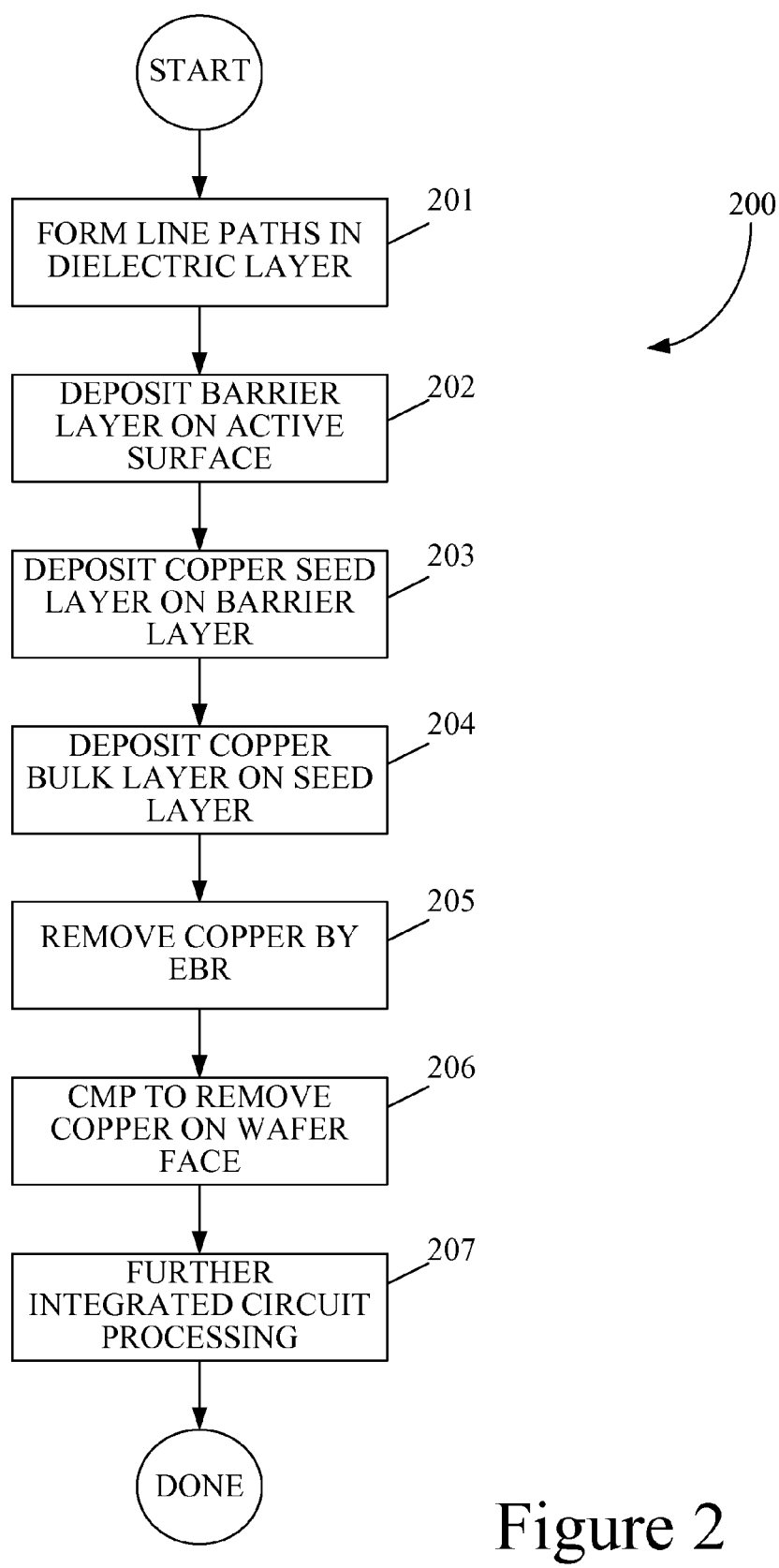
FIG. 2 is a process flow diagram illustrating relevant operations employed to form conductive copper lines a Damascene process in the context of this invention.

While details of certain embodiments may be found below in this application, a short description of a typical Damascene process will now be provided to facilitate understanding the context of the present invention as shown in FIG. 2. The process 200 begins with formation of line paths 201 in a previously formed dielectric layer. These line paths may be etched as trenches and vias in a blanket layer of dielectric such as silicon dioxide. They define conductive routes between various devices on a semiconductor wafer. Because copper or other mobile conductive material provides the conductive paths of the semiconductor wafer, the underlying silicon devices must be protected from metal ions (e.g., copper) that might otherwise diffuse into the silicon. To accomplish this, the process includes depositing a thin diffusion barrier layer 202 before depositing the metal. Suitable materials for the diffusion barrier layer include tantalum, tantalum nitride, tungsten, titanium, and titanium tungsten. In a typical embodiment, the barrier layer is formed by a PVD process such as sputtering.

The wafer is now nearly ready to have its line paths inlayed with the electrofill copper. Before electrofilling, a conductive surface coating is applied. In the depicted process, this is accomplished by depositing a copper seed layer on the barrier layer at 203. A PVD process such as sputtering may be employed to this end. A thicker layer of bulk copper is then deposited over the seed layer 204, typically by electroplating using an electroplating solution. The copper is deposited to a thickness that completely fills the various line paths in the dielectric layer.

During the deposition of PVD copper, deposition in some unwanted areas cannot be avoided. This copper must be removed, and this is accomplished by the edge bevel removal (EBR) and/or backside etch (BSE) processes. With EBR at 205, a copper etchant is applied to the front edge of the wafer in a thin stream. The etchant is typically applied under viscous flow conditions so that it remains in a thin, viscous layer near the point on the wafer where it is applied, and thus avoids splashing the interior of the wafer and removing wanted copper from the active circuit region. It is important for the stream of etchant to apply evenly; otherwise variations in edge exclusion result. A uniform edge exclusion creates the maximum active and useable surface area. Because the etchant is also generally applied with a radial velocity component, and because of the centripetal acceleration effects of the rotating wafer, the thin viscous layer flows outward, down over the side edge and a few millimeters onto the backside, thus accomplishing removal of the PVD copper from all three of these areas. In most cases, EBR removes the plated film near the edge of the wafer. After EBR, the electroplated copper is planarized, generally by chemical-mechanical polishing (CMP) down to the dielectric at 206 in preparation for further processing (207), generally the addition of subsequent dielectric and metallization layers.

Figure 3:
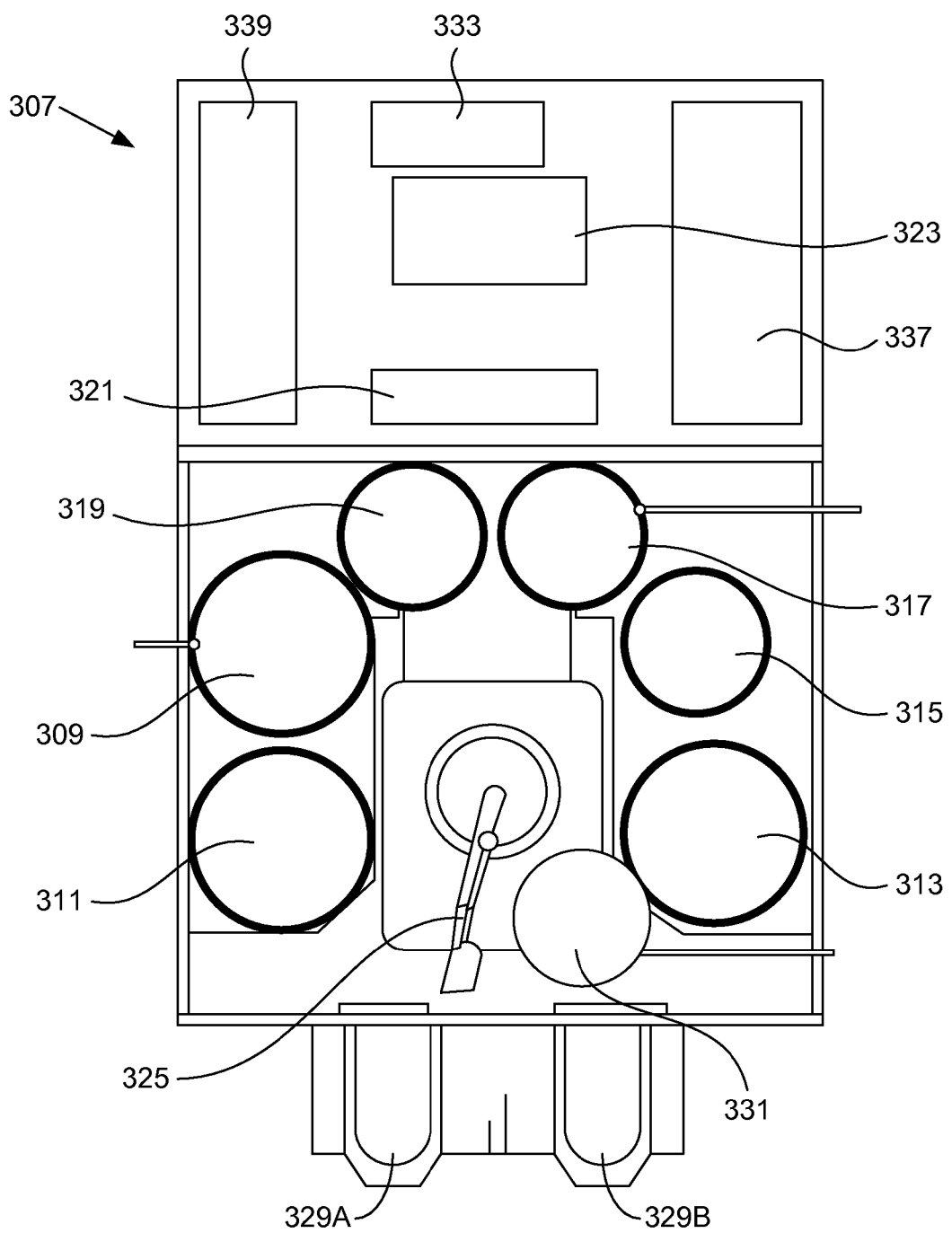
FIG. 3 is a block diagram illustrating a group of modules used to form copper conductive lines on an integrated circuit.

FIG. 3 depicts an electrofill system 307 in which the invention may reside. The specific system includes three separate electrofill modules 309, 311 and 313. System 307 also includes three separate post electrofill modules (PEMs) 315, 317 and 319. Each of these may be employed to perform each of the following functions: edge bevel removal, backside etching, and acid cleaning of wafers after they have been electrofilled by one of modules 309, 311, and 313. System 307 also includes a chemical dilution module 321 and a central electrofill bath 323. This is a tank that holds the chemical solution used as the electroplating bath in the electrofill modules. System 307 also includes a dosing system 333 that stores and delivers chemical additives for the plating bath. A chemical dilution module 321 stores and mixes chemicals to be used as the etchant in the post electrofill modules. A filtration and pumping unit 337 filters the plating solution for central bath 323 and pumps it to the electrofill modules. Finally, an electronics unit 339 provides the electronic and interface controls required to operate system 307. Unit 339 may also provide a power supply for the system.

In operation, a robot including a robot arm 325 selects wafers from a wafer cassette such as a cassette 329A or a cassette 329B. Robot arm 325 may attach to the wafer using a vacuum attachment or some other attaching mechanism.

To ensure that the wafer is properly aligned on robot arm 325 for precision delivery to an electrofill module, robot arm 325 transports the wafer to an aligner 331. In certain embodiments, aligner 331 includes alignment arms against which robot arm 325 pushes the wafer. When the wafer is properly aligned against the alignment arms, the robot arm 325 moves to a preset position with respect to the alignment arms. In other embodiments, the aligner 331 determines the wafer center so that the robot arm 325 picks up the wafer from the new position. It then reattaches to the wafer and delivers it to one of the electrofill modules such as electrofill module 309. There, the wafer is electrofilled with copper metal. Electrofill module 309 employs electrolyte from a central bath 323.

After the electrofill operation completes, robot arm 325 removes the wafer from electrofill module 309 and transports it to one of the post-electrofill modules such as module 317. There unwanted copper from certain locations on the wafer (namely the edge bevel region and the backside) is etched away by an etchant solution provided by chemical dilution module 321. The wafer is also cleaned, rinsed, and dried.

Preferably the wafer is precisely aligned within post electrofill module 317 without making use of aligner 331. To this end, the post electrofill modules may be provided with an wafer chuck capable of aligning the wafer. In an alternative embodiment, the wafer is separately aligned within aligner 331 after electrofill and prior to edge bevel removal in module 317.

After processing in post electrofill module 317 is complete, robot arm 325 retrieves the wafer from the module and returns it to cassette 329A. From there the cassettes can be provided to other systems such as a chemical mechanical polishing system for further processing.

The Post Electrofill Module (PEM) and Process

Figure 4:
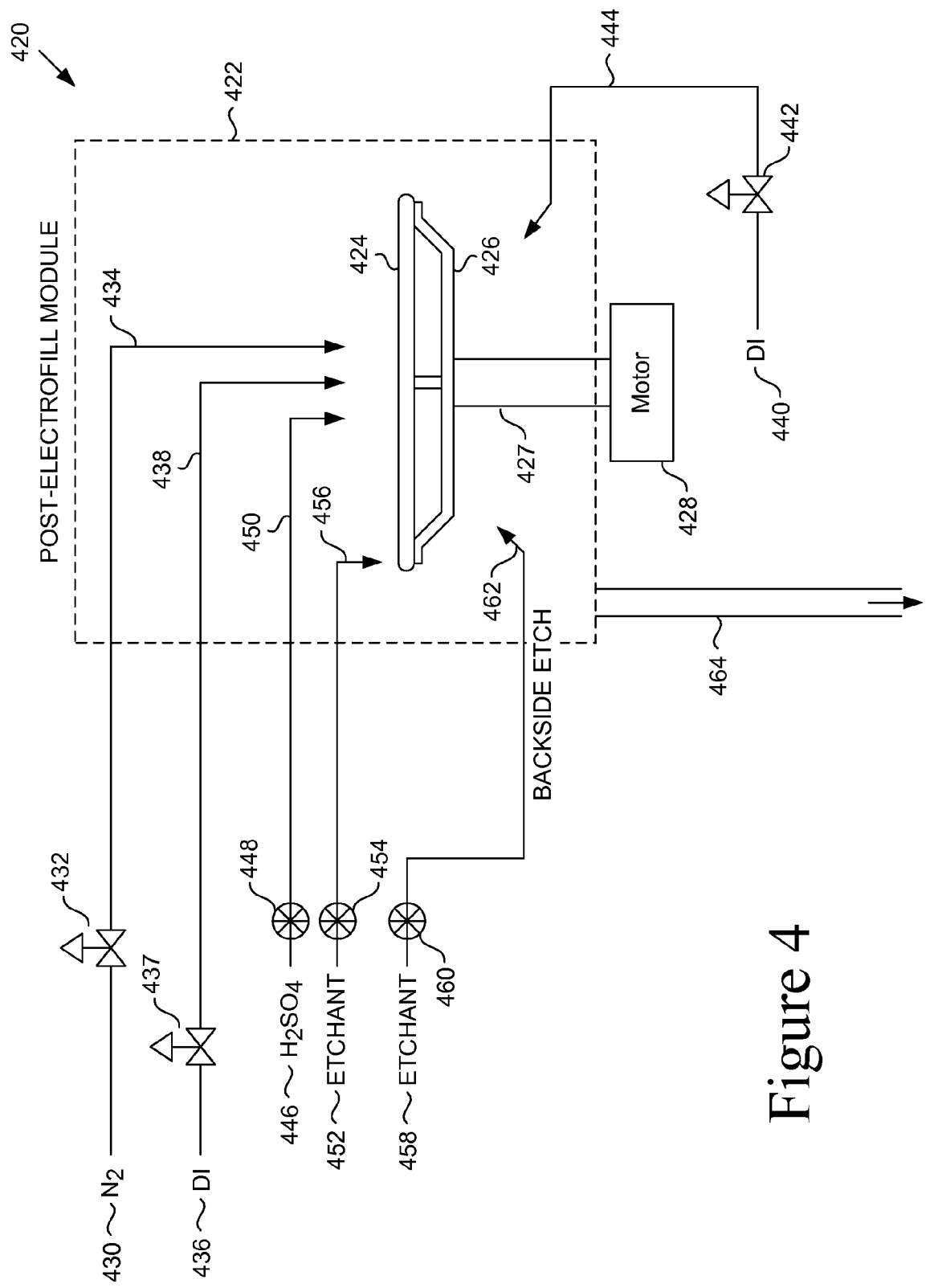
FIG. 4 is a block diagram illustrating various elements of a post-electrofill module in accordance with one embodiment of this invention.

FIG. 4 schematically illustrates an embodiment of a post-electrofill module 420 suitable for use with this invention. As shown, module 420 includes a chamber 422 in which a semiconductor wafer 424 rotates. Wafer 424 resides on a wafer chuck 426 which imparts rotational motion to wafer 424. Chamber 422 is outfitted with a drain and associated drain line 464. The drain allows the various liquid streams provided to chamber 422 to be removed for waste treatment.

A motor 428 controls the rotation of chuck 426. Motor 428 should be easy to control and should smoothly transition between various rotational speeds. It may reside within chamber 422. In some embodiments, to protect against damage from liquid etchant, motor 428 resides outside of chamber 422 and is separated therefrom by a seal through which a rotating shaft 427 passes. Preferably, motor 428 can rapidly accelerate and decelerate (in a controlled fashion) chuck 426 and wafer 424 at rotation rates between 0 and about 2000 rpm. The motor speed and other operations should be controllable by a computer.

Chuck 426 may be of a design that holds wafer 424 in position during various rotational speeds. It may also facilitate alignment of wafer 424 for the etching process. Chamber 422 may be of any suitable design that confines the liquid etchant within its interior and allows delivery of the various fluids to wafer 424. It should be constructed of an etchant resistant material and include ports and nozzles for the various liquid and gaseous streams used during etching and cleaning.

Gaseous nitrogen or other non-reactive gas may be provided to post electrofill module 420 from a gas source 430. Nitrogen from source 430 is delivered to chamber 422 under the control of a valve 432. The gaseous nitrogen is delivered into chamber 422 via a line and nozzle 434 positioned to deliver the nitrogen in a downward approximately laminar flow to wafer to speed up the drying process. Although SRD chucks (spin/rinse/dry only) may rotate at about 5000 rpm, at that speed turbulence and entrainment may be too great for the EBR chuck. In general, rotation speeds of about 0-2500 rpm, preferably 100-1500 rpm, and even more preferably 500-1300 rpm, are consistent with the present invention.

The next input is a source of deionized water 436. The deionized water is delivered to chamber 422 under the control of a valve 437 and through a delivery line and nozzle 438. Note that line 438 directs deionized water onto the top of wafer 424. This enables rinsing of the wafer's top side.

A similar deionized water system provides a stream or fan of deionized water to the backside of wafer 424. This deionized water is provided from a source of deionized water 440, which may be the same as source 436. A valve 442 controls the flow of deionized water onto the backside of wafer 424 via a line and nozzle 444. The nozzle associated with 444 may have the same design criteria as just mentioned for nozzle 438. The goal is to rinse etchant from the backside of wafer 424.

An acid rinse may be conducted on the front side of wafer 424. To this end, a source of sulfuric acid 446 provides sulfuric acid to a delivery line and nozzle 450. Other acids may be used as appropriate or combined with sulfuric acid. For example, hydrogen peroxide may be used. Preferably, this module includes a valve that controls the delivery of sulfuric acid to module 420. The flow of sulfuric acid into chamber 422 may be monitored by a flow meter 448. Note that in the depicted embodiment nozzle 450 is oriented to direct sulfuric acid onto the center of the front side of wafer 424. After the acid is delivered to the center of the wafer it then spins out into the edge of the wafer during rotation. This solution is applied to remove residual copper oxide which remains after oxidizing (etching) the wafer and aids in the overall cleaning of the wafer. Only a relatively small amount of acid is typically required (e.g., 0.5 to 2 milliliters/200 mm wafer). After its application, the wafer's front side is rinsed with deionized water through nozzle 438.

Liquid etchant used to remove copper or other unwanted metal from portions of wafer 424 is provided from a source of liquid etchant 452 as shown. The etchant passes through a flow meter 454 and is delivered to wafer 424 via a line and nozzle 456. Preferably, the etchant is delivered precisely to the edge bevel region of wafer 424 to remove PVD copper and electrofilled copper in that region only.

A second liquid etchant stream may be delivered to the backside of wafer 424 in order to etch off any copper or other unwanted metal that may have been deposited on the backside of wafer 424. As shown, such etchant is delivered from an etchant source 458. Preferably, this is the same source as 452.

As shown, etchant from source 458 passes through a flow meter 460 and through a nozzle 462, which directs it onto the backside of wafer 424.

Figure 5:
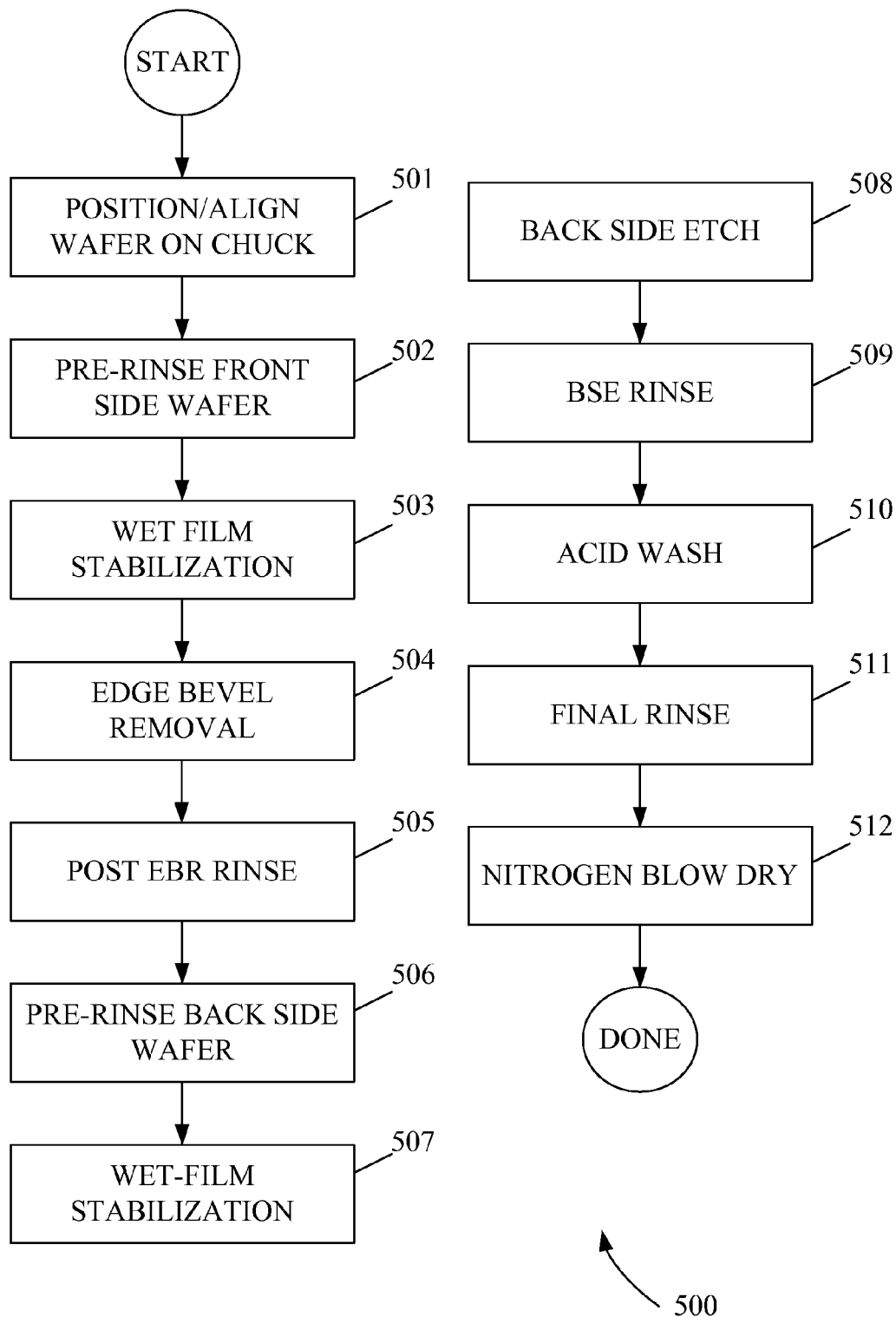
FIG. 5 is a process flow diagram illustrating a typical sequence of operations employed with a post-electrofill module in accordance with an embodiment of this invention.

An example EBR process is illustrated in FIG. 5. The EBR process 500 can be carried out by a post-electrofill module, such as module 420 of FIG. 4, that is specifically designed to carry out the EBR process. The process begins at 501, with a robot arm placing the wafer on the module chuck for EBR processing. The wafer is typically aligned by a number of sloped alignment members and placed on a set of frictional support pins that hold the wafer in place by static friction, even when the wafer is later rotated. After the robot arm retracts, deionized water is applied to the front of the wafer in step 502 where the wafer is spun at about 200-600 rpm in order to pre-rinse the wafer of any particles and contaminants left over from previous steps. The deionized water is then turned off and the wafer is spun up to a speed of between about 350-500 rpm, which creates a uniformly thin layer of deionized water (wet-film stabilization) 503. This wet-film stabilization facilitates an even distribution of the etchant over the front side of the wafer. At this time, at the latest, any alignment pins or clamps that were used to precisely align the wafer in the chuck are retracted from the edge of the wafer.

After wet-film stabilization 503, the core feature of the EBR, actual removal of the edge bevel metal 504 is performed. The EBR etchant is typically applied to the surface of the wafer using a thin nozzle tube, which has a nozzle opening at or near its end. In a specific example, an EBR dispense arm is positioned over the wafer edge. Then EBR is performed under the following conditions: a total of about 3 to 15 milliliters etchant is delivered at a rate of about 0.2 to 3 milliliters/second (more preferably about 0.3 to 0.4 milliliters/second) for a 300 millimeter wafer. In some embodiments, the etchant may be dispensed in two or more operations of different flow rates. In a particular example, the 1 ml of the etchant is dispensed at 0.4 ml/sec for a first operation, then 10 ml of the etchant is dispensed at 0.3 ml/sec for a second operation.

After the required amount of liquid etchant has been applied to the edge of the wafer, deionized water is again applied to the front side of the wafer as a post-EBR rinse 505. This application of deionized water will generally continue through the subsequent operations of backside etching and backside rinsing so as to protect the wafer from any extraneous backside etchant spray and damage. While the deionized water is applied, the dispense arm moves the etchant nozzle away from the wafer.

At generally the same time as commencement of step 505, the backside of the wafer is pre-rinsed 506 with deionized water, which is wet-film stabilized 507 in much the same manner that the front side of the wafer was (e.g., the wafer rotation speed is held at about 350 to 500 rpm). After the flow of deionized water to the wafer backside ends, a backside etch operation 508 is performed—generally with the same etchant that was used for the EBR. In a specific embodiment, a thin jet (initially 0.02 to 0.04 inches in diameter) of liquid etchant is aimed at the center of the wafer backside. The etchant is delivered from a tubular nozzle having a diameter of about 0.02 to 0.04 inches and a length of at least about 5 times the diameter. This etchant then disperses over the entire backside of the wafer. The purpose of the BSE is to remove any residual copper that was formed on the backside of the wafer during formation of the seed layer of PVD copper.

The BSE etchant is typically applied using a spray nozzle. Despite gravity, surface tension generally keeps the etchant in contact with the bottom of the wafer long enough to carry out BSE. Since the chuck arms could interfere with the spraying of etchant on the backside of the wafer, the angle of the spray nozzle may be varied during BSE to ensure thorough application of the etchant. Because the wafer is generally held up by support pins that impinge on the backside of the wafer, the process is generally carried out at two different speeds to ensure that the etchant flows adequately over the entire surface. For instance, the wafer may be rotated at about 350 rpm during part of the BSE and then rotated at 500-700 rpm for the remainder of the BSE. The portions of the backside blocked by the arms will differ at the two speeds, thus ensuring complete coverage. Overall, the BSE process typically takes 1-4 seconds and uses 1 to 5 cubic centimeters of the etchant described below to reduce the concentration of copper on the backside to less than $5 \times 10^{-10}$ atoms per $cm^2$ of substrate.

After BSE, both sides of the wafer (or at least the backside of the wafer) are rinsed with deionized water in step 509 to rinse any liquid etchant, particles and contaminants remaining from the BSE. In step 510, the flow of deionized water to the front side ends and about 2 to 4 milliliters of a dilute acid, generally less than about 15% by weight acid, is applied to the front side of the wafer to remove residual metal oxide and remove the associated discoloration. In a specific embodiment, the acid is applied at a rate of about 2 cc/sec. After the acid rinse, deionized water is once again applied in step 511 to both sides of the wafer, or at least the front side, to rinse the acid from the wafer. In a specific embodiment, the deionized water is applied for about 15-30 seconds at about 300-400 milliliters/min. Finally the wafer can be spun and blow-dried, as desired, on both sides with nitrogen 512. Generally, any drying step is carried out at about 750-2000 rpm for about 10 to 60 seconds, and necessitates a clamping for the wafer once it reaches about 750 rpm. After this processing in the PEM is completed, a robot arm picks up the wafer and puts it in a cassette.

The Wafer Chuck

As discussed above, the wafer chuck design ensures that the EBR etchant flows in a steady viscous stream thereby etching the wafer at constant radii. Uneven or non-uniform edge exclusion would result in less of the wafer being useable for active circuit. Additionally, turbulence induced by the high-speed rotation is believed to entrain droplets from the module chamber wall. The turbulence is a function of chuck speed, which is much higher for 300 mm because the wafer holder is further away. These droplets may be sprayed back onto the clean wafer surface and produce measurable contamination and cause a particle excursion. Such failure mode must be alleviated before the module may be used because particles can cause defects and reduce yield.

Figure 6A:
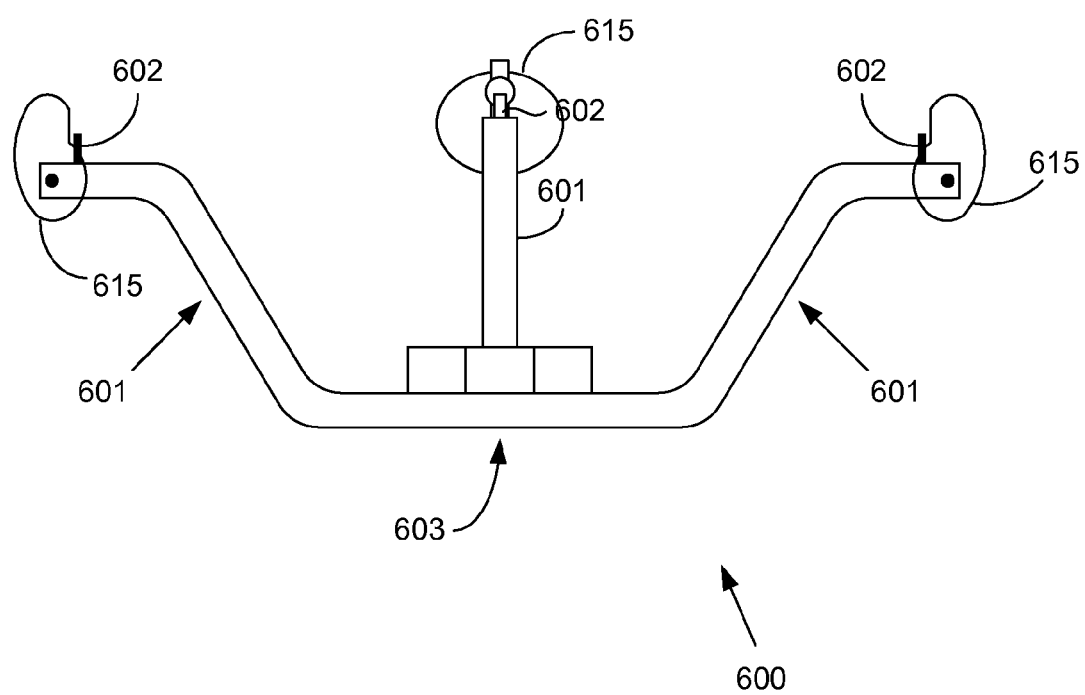
FIG. 6A is a schematic illustration of a simplified wafer chuck.
Figure 6B:
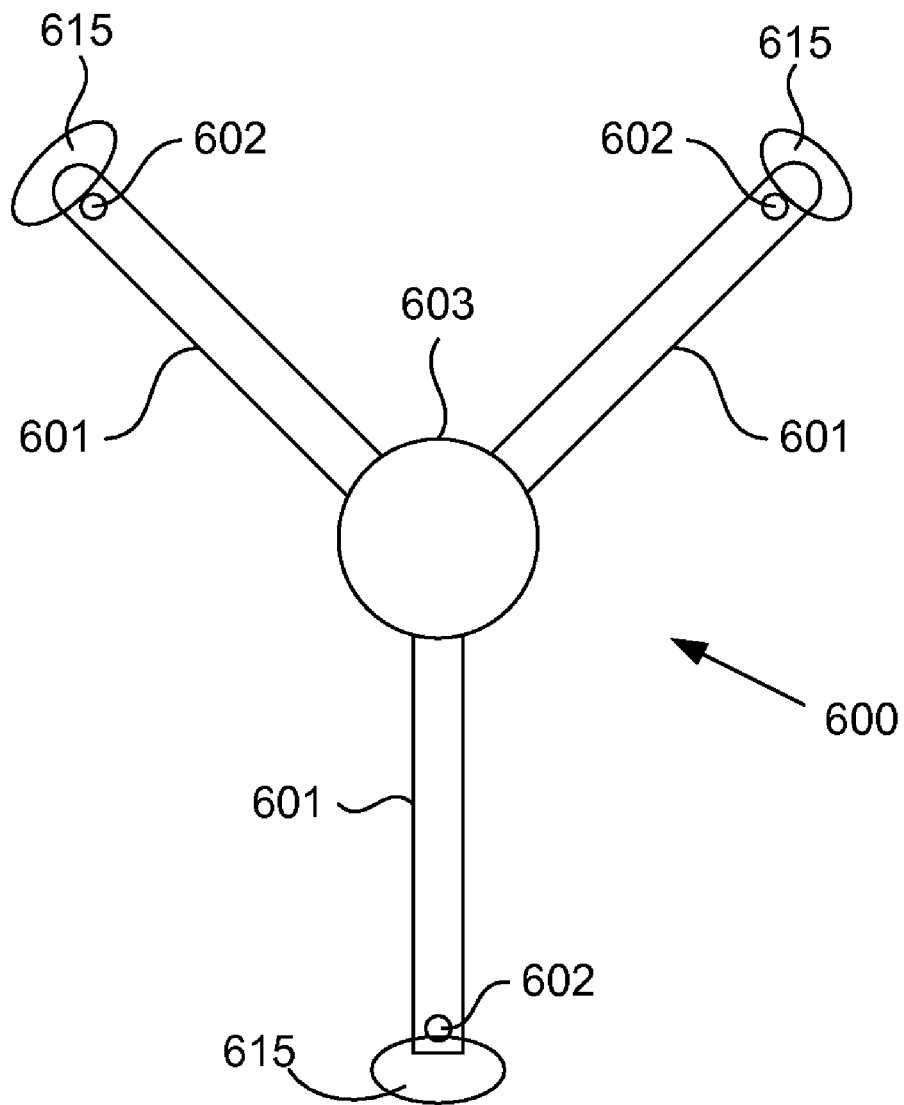
FIG. 6B is a top-view schematic illustration of a wafer chuck with three chuck arms, each with an alignment/clamping member at the end.

FIG. 6A is a highly simplified side-view of portions of a wafer chuck 600 that is used to support and rotate a wafer in a PEM. FIG. 6B is a highly simplified top view of the wafer chuck 600. Wafer chuck 600 is shown with three chuck arms 601. The arms may be evenly spaced around the center of the chuck. At the end of each arm 601 is a cam 615, which aligns the wafer on the chuck 600 and clamps the wafer to prevent movement during rotation. Each chuck arm 601 has a support button or pin 602 that impinges on the bottom of the wafer (wafer not shown).

The wafer chuck 600 and the wafer rotate about a center of rotation in a base 603. Note also that while FIGS. 6A and 6B are shown with only three chuck arms, other embodiments may employ more arms.

Figure 7A:
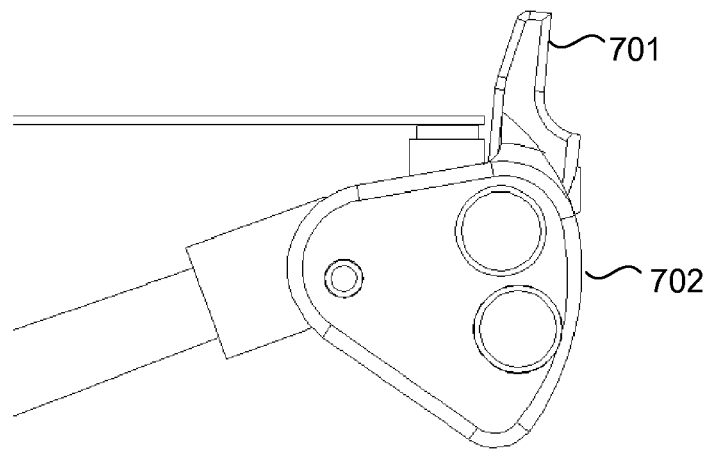
FIGS. 7A and 7B are a schematics illustration of separate alignment and clamping members at the end of a chuck arm.
Figure 7B:
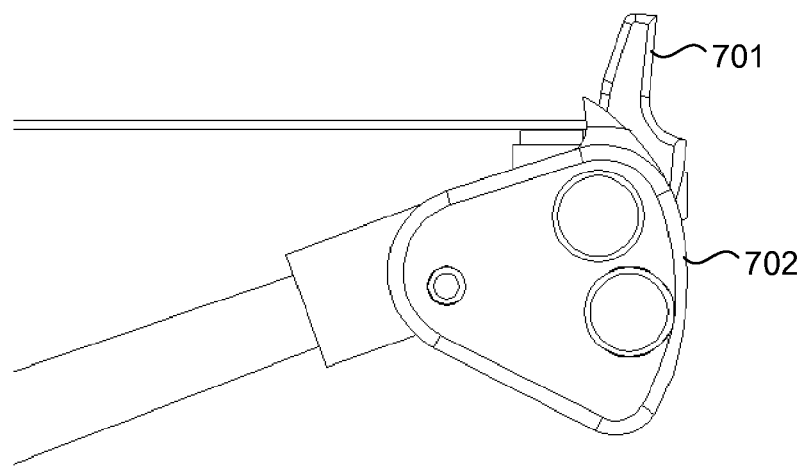

Previous wafer chucks included designs that clamped a wafer in position during an entire EBR process. This, however, prevents uniform distribution of the liquid etchant. Other designs rely on a balance of gravity and centrifugal force to deflect alignment and clamping members. One such cam that may be used with such a design is depicted in FIGS. 7A and 7B. The cam 702 depicted in FIGS. 7A and 7B includes an alignment pin 701 to center the wafer during robot handoff. As the chuck starts rotate to EBR speed, typically 200-400 rpm, the pin rotates away from the wafer edge as the cams rotate upward due to centrifugal force. At this speed range, the cams are not in contact with the edge of the wafer. At high speeds, the cam 702 rotates up to clamp the wafer as shown in FIG. 7B. Note that a cam as depicted in FIGS. 7A and 7B may be used in accordance with certain embodiments described herein; rather than the balance between centrifugal force and gravity determining the position of the alignment and clamping members, cam motion is actuated by a non-contact force. (Non-contact as used herein refers to lack of contact between a non-rotating actuator and any part of the rotating chuck assembly.)

Figure 8:
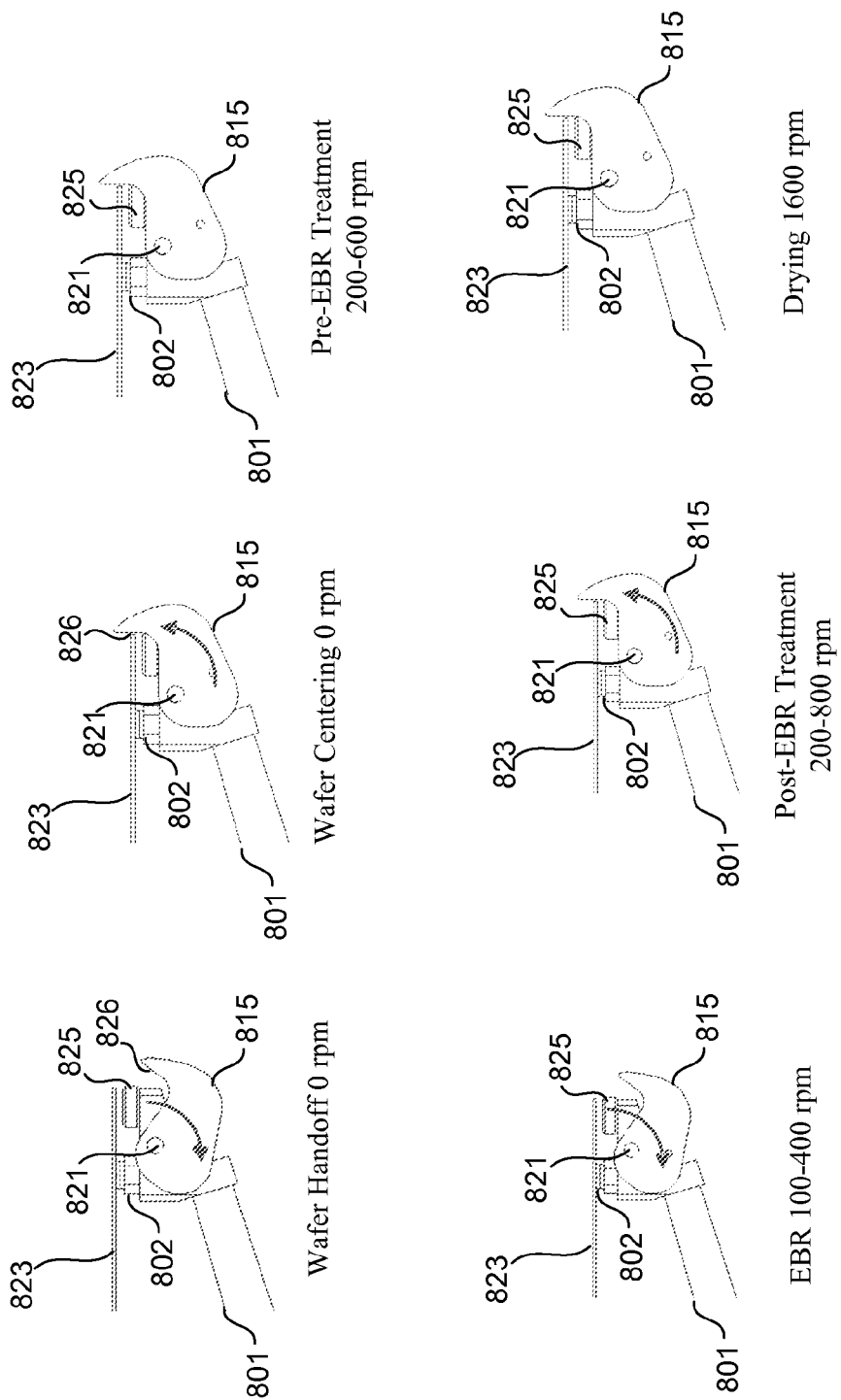
FIG. 8 provides schematic illustrations of positions of a cam of an actuated chuck during a typical sequence of operations in an EBR process in accordance with various embodiments.

In certain embodiments, the cams of the chucks are actuated to open or closed positions, depending on the requirement of the particular process step. In these embodiments, the separate aligning member, e.g., the vertical alignment pin shown above, is eliminated, with the cam serving both the alignment and clamping functions. FIG. 8 shows an example of a process sequence using such an actuated cam. First at wafer handoff, a wafer support button or pin 802 on wafer chuck arm 801 supports a wafer 823, at 0 rpm. Cam 815, including wafer contact point 826, is attached to chuck arm 801 and is rotatable around pivot 821. Hard stop 825 on wafer chuck arm 801 is also shown; hard stop 825 is used to define the endpoint of cam rotation in its closed position. At wafer handoff, the cam is in an open position, rotated away from the wafer 823 and hard stop 825. The cam is then rotated to a closed position for wafer centering at 0 rpm. The hard stop 825 prevents the cam from over-rotation. The wafer is centered on the chuck by the motions of three (or more) cams in contacting the wafer at the wafer contact points. The cams remain in a closed position while chuck is rotated at speeds between about 200-600 rpm for a pre-EBR treatment, e.g., applying deionized water to pre-rinse the wafer of any particle and creating a wet-film on the wafer. The cam is then actuated to open for the EBR process, in which an etchant is applied to the wafer while the chuck rotates at a speed between 100-400 rpm. The cam is then moved to a closed position for the post-EBR treatment, e.g., applying deionized water, at a rotation of 200-800 rpm, and the drying operation, at a rotation of up to 1600 rpm. Typically, the alignment position and the clamping position of the mechanism will be the same, and are defined by hard stop 825 against which cam 815 rests in the clamping and alignment positions. As described further below, in certain embodiments, the cam is held in the closed (alignment/clamping) position by a spring or some other force-generating mechanism. Magnetic force is then applied to actuate the cam and move it outwardly, rotating it away from the wafer 823. In other embodiments, the closed position is held by the application of magnetic force and the open position by a countering force, such as a spring force.

The magnetically actuated cams have various advantages. The cams may be moved between open and closed positions at any rotational speed; thereby eliminating constraints on acceleration/deceleration and speed. Moreover, in designs in which the position of alignment and clamping members is controlled by rotation speed, the only force that keeps the wafer centered during acceleration/deceleration is the friction between the support buttons and the wafer. The wafer can thus slide off center and cause EBR non-concentricity if the friction force is not properly balanced or insufficient for the acceleration/deceleration used. The actuated cams described herein, by contrast, allow the wafer to be fully clamped during acceleration/deceleration, allowing faster acceleration and higher throughput.

Because magnetic actuation is non-contact, motion is smooth and continuous. In certain embodiments, while the cam is in an open position, the aligning/clamping members are below the plane of the wafer. This is advantageous during the EBR phase, as shown in FIG. 8, as dispensed EBR etchant does not tend to deflect off the cam, and if it were to, it does not land on the front side of the wafer as may happen with chuck components located above the surface of the wafer during EBR. Such deflections can cause streak defects. Similarly, aligning members or other components located close to the wafer during EBR can disturb etchant flow, especially for low edge exclusion (less than 2 mm) and can cause edge exclusion non-uniformity. Again, because there are no deflection or reflection surfaces above the wafer plane during EBR using certain embodiments described herein, these problems are eliminated.

The magnetically actuated chucks rely on a self-compensated force balance system: a spring force or other force mechanism acts to rotate the cam or other constraining member in a first direction, typically inward to the closed position, and a repulsive magnetic force acts to move the constraining member in the opposite direction, typically outward to the open position. Accordingly, in certain embodiments, the chuck includes a member having a spring and a magnet, or a member that can be acted up by such balancing forces. While in certain embodiments, the cam or other constraining member is directly acted upon by these balancing forces, more commonly the constraining member is actuated via a linkage system as described further below.

Figure 9:
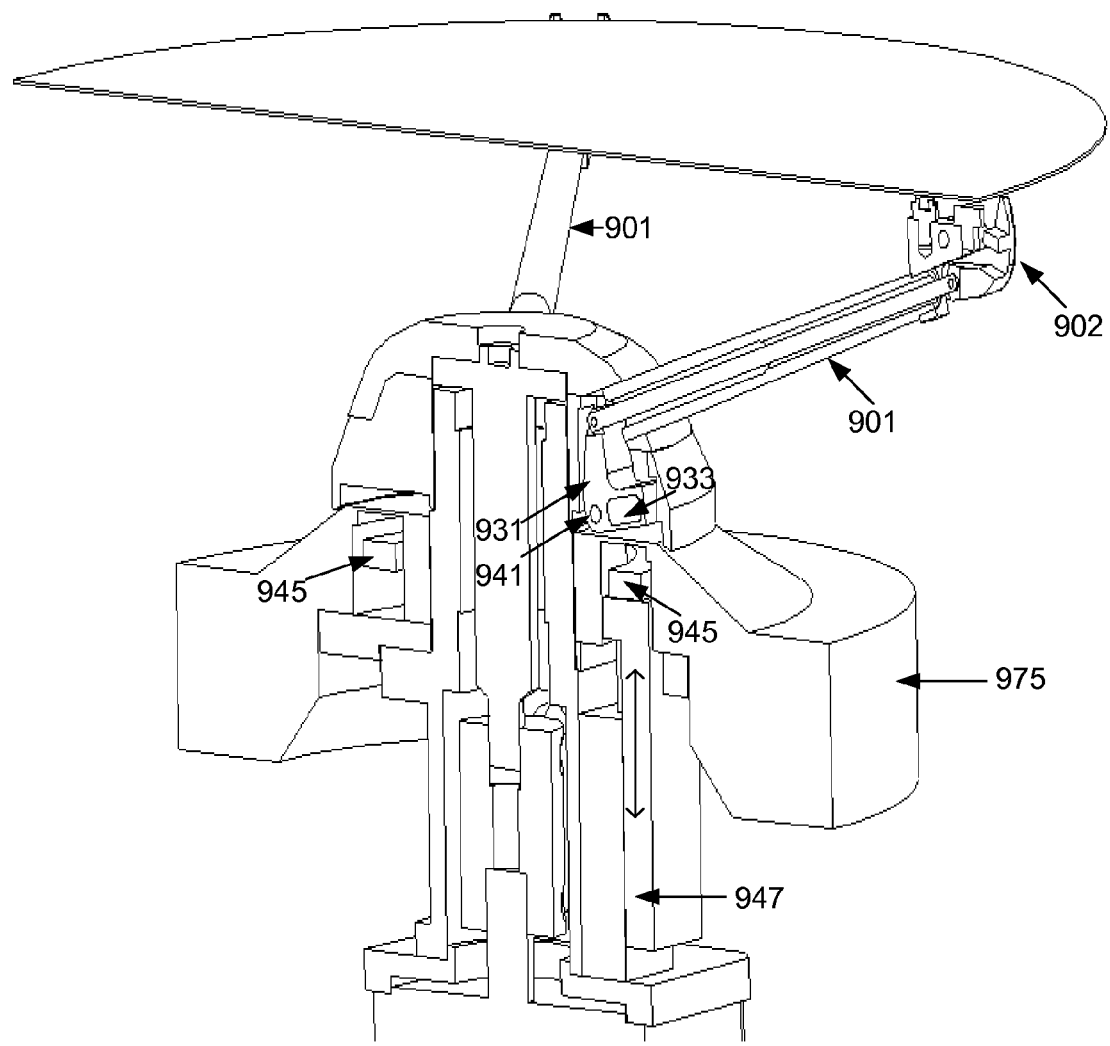
FIG. 9 is a cross-sectional schematic of a magnetically actuated chuck assembly, including a linkage system, according to certain embodiments.

FIG. 9 depicts a cross sectional schematic of a magnetically actuated chuck assembly, including a linkage system. Arms 901 are spaced 120° apart (third arm not shown). Each arm 901 is connected to a driving link 931 at one end and cam 902 at the other. Driving link 931 is an L-shaped member including a permanent magnet block 933 and torsion spring (not shown), and is rotatable around fixed pivot 941. The assembly includes a permanent magnet ring 945 located below the driving links 931 and driven by a linear actuator 947. The permanent magnet blocks 933 and the permanent magnet ring 945 are arranged such that the same poles face each other, i.e., either S-S or N-N. Because the facing poles have the same polarity, bringing the magnet ring into proximity with the magnet blocks (or activating the magnetic ring if it is an electromagnet) causes a repulsive magnetic force. For discussion, this is referred to as the magnet ring engaging the magnet blocks.

Figure 10:
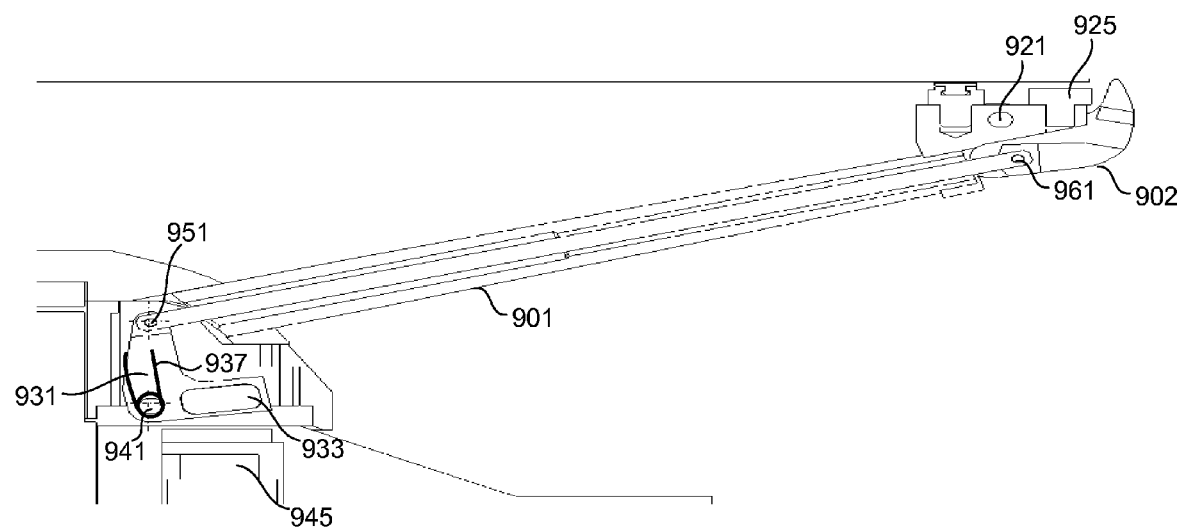
FIG. 10 shows a cross-sectional view of a four-bar linkage system of a magnetically actuated chuck assembly in accordance with various embodiments.

FIG. 10 shows a cross-sectional view of a four-bar linkage system, including driving link 931, arm 901 (second link) and cam 902 (third link). The ground link of the four-bar linkage is not present. Arm 901 is rotatably coupled to a driving link 931 via a floating pivot 951 at one end. Cam 902 is rotatably coupled to arm 901 via a floating pivot 961 and is rotatable around a fixed pivot 921.

Magnetic force acts to rotate the link inward and force from spring 937 acts to rotate the link outward, as depicted. These forces form a self-compensated force balance system. As the magnetic ring 945 is lifted to an extended position, the magnetic repulsion force overcomes the spring force to drive the linkage system to open cam 902. In this embodiment, the magnetic force acts to rotate the driving link inward around pivot 941. Arm 901, coupled to the driving link via pivot 951, moves inward. Cam 902, coupled to arm 901 via link 961, is caused to rotate around pivot 921 outward to an open position.

As the magnet ring is lowered to a retracted position, the repulsive magnetic force between the permanent magnet blocks 933 and the permanent magnet ring 945 become smaller and smaller. The spring force then drives the linkage to close the cam 902 until it hits hard stop 925.

Because the repulsive force between the permanent magnet blocks 933 and the permanent magnetic ring that moves the cam between open and closed positions does not involve physical contact, the motion is smooth and continuous. Moreover, the cams can be open or closed at any rotational speed, without sparking or other consequences of physically contacting an assembly moving at speeds of up to 1600 rpm or higher. As the magnetic ring engages the magnetic blocks, the repulsive force between the magnetic ring and the magnetic blocks increases just enough to rotate the driving link, resulting smooth and controlled rotation with a simple mechanism. This is in contrast to using an attractive magnetic force that will increase exponentially as the magnets engage, which results in the motion difficult to control.

As indicated above, the closed position of the constraining member may be defined by a hard stop. The outward surfaces of the hard stop pins are precisely shaped after the pins are installed to achieve accurate concentricity. The constraining members are closed to actively center the wafer. Even if a wafer is misplaced on the chuck by a large amount (e.g., 2 mm off center), the active centering precisely centers the wafer prior to the EBR process. This is in contrast to vertical aligning pins that form a tight capture diameter during wafer handoff, in which a misplaced wafer may hang onto a pin, rather than rest on the support buttons.

Various modifications to the assembly shown in FIGS. 9 and 10 may be made without detracting from the spirit of the invention, are within its scope. For example, while a four-linkage system is depicted, other linkage systems may be employed instead, e.g., a three-bar linkage system, various planar linkage systems including crank-slider, pantograph linkages, etc. Linkage system that are jointed together and attached to the rotating chuck structure with simple pivot joints (such as in FIGS. 9 and 10) are advantageous as lower precision parts and a wider range of materials can be used for these pivot joints, e.g., as compared to sliding joints or pushrod style joints. This is especially important in wet environments. Regardless of the linkage system, cam or other constraining member movement is actuated by repulsive magnetic force and a spring, or other balancing, force.

Magnetic force actuation (and thus cam movement) in the design depicted in FIGS. 9 and 10 is controlled the linear motion of the permanent magnetic ring 945. Any type of linear actuator may be used to move the ring up or down as desired, including pneumatic, electric, hydraulic, etc. Note that the speed with which the cam opens and closes is controllable by the speed at which the linear actuator moves up and down. Other methods of controlling the magnetic force may be used, including a stationary electromagnetic ring, activate-able by running a current through it. Also, as described above, the permanent magnet is a ring or annulus disposed below the permanent magnet blocks of the driving links. As a result, regardless of the rotational position of the chuck arms, repulsive magnet force may be generated to move and maintain the cam in an open position.

The magnets are designed such that the repulsive magnetic force that acts to move the cam is strong enough to overcome the centrifugal force that acts on the linkage members and cam when the chuck is rotating. In certain embodiments, the magnets are designed such that the magnetic force is strong enough to overcome the additional centrifugal force for proper cam opening and closing actions in the design speed range of 0-400 rpm. In a typical process, the opening of the cams is not required at speeds higher than 400 rpm, and that centrifugal force helps ensure that the cams are closed. Inner and outer diameters of the magnet ring are chosen so that the top face of the annulus faces the bottom face of the permanent magnet block. As an example, a permanent magnet block of 0.75×0.4×0.2 inches is coupled to each driving link, with a permanent magnet ring of 3.6 in ID×3.4 in OD by 0.2 in thickness. Any appropriate permanent magnet may be used, e.g., alnico, ticonal, or other rare earth magnet.

In the embodiment depicted in FIGS. 9 and 10, the driving links are spring-loaded such that a spring force counters the non-contact magnetic force. Other countering forces may be used in addition to or instead of a spring force. For example, a second permanent magnet block and second permanent magnet ring may be arranged to provide a repulsive magnetic force to counter that of the permanent magnet/magnetic ring described above.

In certain embodiments, components of the chuck assembly including the linear actuator and permanent magnetic ring are isolated from the wet environment. Returning to FIG. 9, a mounting plate or cover 975 is shown. The cover 975 is disposed between the permanent magnetic ring 945 and the driving link 931 and is made of a material, e.g., thin plastic, that does not interfere with the repulsive magnetic force generated between permanent magnetic ring 945 and permanent magnet block 933. The cover shields the permanent magnetic ring 945, linear actuator 947 and any electric components from the wet etchants and other fluids the wafer is exposed to during the pre-EBR, EBR and post-EBR processes.

While this invention has been described in terms of a few preferred embodiments, it should not be limited to the specifics presented above. Many variations on the above-described preferred embodiments, may be employed. Note, for example, that other metal deposition processes (e.g., non-copper and/or non-PVD processes) frequently present the same problems as outlined above for the copper seed layer PVD process. In each case, unwanted metal must be removed after the deposition process. Further, unwanted metal may have to be removed from locations other than the edge of the semiconductor wafer. The present invention may be employed to etch unwanted metal in these cases. In other embodiments, a mechanism other than a clamping/alignment mechanism may be employed with the actuation and linkage systems described above. For example, a spraying mechanism or component may be attached to the end of the wafer arm and actuated as described above with reference to the constraining mechanism. In still other embodiments, the non-contact actuation and linkage assemblies may be advantageously used for actuating any rotating member or device in the semiconductor processing and other fields. Therefore, the invention should be broadly interpreted with reference to the following claims.

What is claimed is:

1. A wafer chuck assembly for a module that processes wafers, the assembly comprising:
   a linkage system comprising a driving link movable in a first rotational direction by a first force and movable in a second rotational direction opposite the first rotational direction by a repulsive magnetic force;
   a clamping member connected to said linkage system and moveable via the linkage system between a clamping position and a non-clamping position, wherein the clamping member in the clamping position clamps a rotating wafer by constraining the wafer at its edge; and
   an actuation assembly to provide non-contact actuation of the linkage system to move the clamping member between the clamping position and the non-clamping position.

2. The wafer chuck assembly of claim 1 wherein the actuation assembly comprises a annular magnetic member.

3. The wafer chuck assembly of claim 1 wherein the driving link is coupled to a spring mechanism, said spring mechanism providing the first force.

4. The wafer chuck assembly of claim 2 wherein the driving link is coupled to a permanent magnet having a first surface that faces a surface of the annular magnetic member, wherein the magnetic polarities of said first surface and said surface of the annular magnetic member are the same.

5. The wafer chuck assembly of claim 1 wherein the clamping member is a cam comprising a pivot pin about which the cam rotates to move.

6. The wafer chuck assembly of claim 2 wherein the actuation assembly further comprising a linear actuator to extend the annular magnetic member to and retract the annular magnetic member from a position proximate to the linkage system.

7. The wafer chuck assembly of claim 6 wherein extension of the annular magnetic member to the position proximate to the linkage system moves the cam to a non-clamping position.

8. The wafer chuck assembly of claim 6 wherein retraction of the annular magnetic member from the position proximate to the linkage system moves the cam to a clamping position.

9. The wafer chuck assembly of claim 1 further comprising a shield between the linkage system and the actuation assembly.

10. The wafer chuck assembly of claim 1 further comprising a stop member that defines the clamping position.

11. A wafer chuck comprising:
    an actuating assembly comprising an annular magnet having a top face;
    a plurality of constraining sub-assemblies, each comprising:
        a first magnet having a first face arranged to oppose said top face of the annular magnet;
        a driving link, said driving link coupled to said first magnet and coupled to a mechanism, wherein engagement between the first magnet and the annular magnet provides a magnetic force to rotate said driving link in a first direction and wherein said mechanism provides a force to counter said magnetic force;
        a constraining member coupled to said driving link to rotate about a first fixed pivot; wherein rotation of the constraining member about the first fixed pivot moves the constraining member between a constraining position and a non-constraining position, wherein the constraining member in its closed position constrains a wafer at its edge.

12. The wafer chuck of claim 11 further comprising a shield disposed between the annular magnet and the plurality of constraining sub-assemblies.

13. The wafer chuck of claim 11 wherein the constraining member of each sub-assembly is coupled to the driving link of said sub-assembly via a second link.

14. The wafer chuck of claim 11 wherein the mechanism is a spring mechanism and the force to counter said magnetic force is a spring force.

15. The wafer chuck of claim 11 comprising a linear actuator to extend the annular magnetic member to and retract the annular magnetic member from a position proximate to the driving link, wherein extending the annular magnetic member to the position proximate to the driving link engages annular magnetic member with the first magnet.

16. A wafer chuck assembly for a module that processes wafers, the assembly comprising:
   a linkage system;
   a clamping member connected to said linkage system and moveable via the linkage system between a clamping position and a non-clamping position, wherein the clamping member in the clamping position clamps a rotating wafer by constraining the wafer at its edge and wherein the clamping member is a cam comprising a pivot pin about which the cam rotates to move; and
   an actuation assembly to provide non-contact actuation of the linkage system to move the clamping member between the clamping position and the non-clamping position.

17. The wafer chuck assembly of claim 16 wherein the actuation assembly comprises a annular magnetic member.

18. The wafer chuck assembly of claim 17 further comprising a driving link coupled to a permanent magnet having a first surface that faces a surface of the annular magnetic member, wherein the magnetic polarities of said first surface and said surface of the annular magnetic member are the same.

19. The wafer chuck assembly of claim 16 wherein the linkage system comprises a driving link movable in a first rotational direction by a first force and movable in a second rotational direction opposite the first rotational direction by a repulsive magnetic force, wherein the driving link is coupled to a spring mechanism, said spring mechanism providing the first force.

20. The wafer chuck assembly of claim 17 wherein the actuation assembly further comprising a linear actuator to extend the annular magnetic member to and retract the annular magnetic member from a position proximate to the linkage system.

21. The wafer chuck assembly of claim 20 wherein extension of the annular magnetic member to the position proximate to the linkage system moves the cam to a non-clamping position.

22. The wafer chuck assembly of claim 20 wherein retraction of the annular magnetic member from the position proximate to the linkage system moves the cam to a clamping position.

23. The wafer chuck assembly of claim 16 further comprising a shield between the linkage system and the actuation assembly.

24. A wafer chuck assembly for a module that processes wafers, the assembly comprising:
   a linkage system;
   a clamping member connected to said linkage system and moveable via the linkage system between a clamping position and a non-clamping position, wherein the clamping member in the clamping position clamps a rotating wafer by constraining the wafer at its edge;
   an actuation assembly to provide non-contact actuation of the linkage system to move the clamping member between the clamping position and the non-clamping position; and
   a shield between the linkage system and the actuation assembly.

25. The wafer chuck assembly of claim 24 wherein the actuation assembly comprises a annular magnetic member.

26. The wafer chuck assembly of claim 25 further comprising a driving link coupled to a permanent magnet having a first surface that faces a surface of the annular magnetic member, wherein the magnetic polarities of said first surface and said surface of the annular magnetic member are the same.

27. The wafer chuck assembly of claim 24 wherein the linkage system comprises a driving link movable in a first rotational direction by a first force and movable in a second rotational direction opposite the first rotational direction by a repulsive magnetic force, wherein the driving link is coupled to a spring mechanism, said spring mechanism providing the first force.

* * * * *